April 3, 1956

L. PESSEL 2,740,193

METHOD OF SOLDERING PRINTED CIRCUITS

Filed July 1, 1953

INVENTOR.
LEOPOLD PESSEL

BY J. L. Whittaker
ATTORNEY

2,740,193

METHOD OF SOLDERING PRINTED CIRCUITS

Leopold Pessel, Wyndmoor, Pa., assignor to Radio Corporation of America, a corporation of Delaware Application July 1, 1953, Serial No. 365,418

10 Claims. (Cl. 29—487)

This invention relates, in general, to an improved method of soldering and, more particularly, to an improved method of soldering simultaneously all of the connections of an assembly which includes a plurality of electrical conductors disposed on a surface of electrically insulating material.

This invention is an improvement over that described in my U. S. patent application, Serial Number 289,768, filed May 24, 1952, now Patent 2,671,264, issued March 9, 1954, and assigned to the assignee of this application.

Although various types of printed circuits have been utilized in the past, one common type has comprised a sheet of electrically insulating material, such as laminated sheets of paper impregnated with a synthetic resin and carrying on one surface of the sheet one or more electrical conductors in the form of thin, flat stripes or strips integrally united to the insulating material. Where it is desired to mount a number of circuit components on the other side of the sheet of insulating material and connect them at many points to the printed conductors on the side previously mentioned, there is a considerable problem in making the connections rapidly and efficiently. In a typical assembly, over one hundred connections may be involved, and to make each one of these connections individually with a soldering iron is a tedious process. Consequently, it is desirable to be able to use a process which will enable an operator to solder all of the connections in the same operation or operations. One method of soldering all such connections simultaneously is a dip-soldering technique. In this type of process, the entire side of the assembly containing the printed conductors, with the leads from the circuit components projecting through the various points, can be dipped face down in a bath of molten solder and removed after a brief period of immersion. This results in coating the conductors with solder and soldering all the connections at the same time. However, it has been found that, when the conductors are closely spaced, some of the solder almost always bridges across the closely spaced conductors in places where it is not wanted and therefore causes "shorts."

The present invention relates to an improved process of dip soldering an assembly such as above described in such a manner as to eliminate all excess solder connections between points on the printed circuit where they are not desired.

One object of the present invention is to provide an improved dip-soldering technique applicable to printed circuits.

Another object of the invention is to provide an improved process of dip-soldering printed circuits where the conductors are integrally united to a surface of an insulating material.

Another object of the invention is to provide an improved process of soldering, simultaneously, a large number of conventional circuit components to a printed circuit.

Still another object of the invention is to provide an improved soldering process including a method of removing excess solder from spaces between closely spaced electrical conductors united to a surface of a body of electrically insulating material.

These and other objects will be more apparent, and the invention will be more clearly understood from the following detailed description and the accompanying drawings of which:

In general, the process of the present invention comprises an initial step of immersing the under face of the assembly to be soldered in a conventional bath of molten solder. As a result of this step, each of the electrical conductors is coated with solder, but excess solder usually remains adhered to adjacent, closely spaced conductors and in contact with the electrically insulating surface between the conductors. The next step in the process comprises immersing the assembly in a second bath of molten material. The second bath contains solder which may be similar to that in the first bath and a top layer of a relatively inert organic liquid which may be an organic derivative of organic phosphorus compounds alone or in combination with an organic acid or derivatives thereof having a carboxyl group, or in combination with an oil, wax or resin, or in combination with a mixture of an organic acid or derivative and an oil, wax, or resin. All of the selected substances must be thermally stable between about 350° F. and 550° F. The assembly is exposed to and preferably manipulated in the second bath until substantially all of the solder adhering to adjacent, closely spaced conductors is removed therefrom. As a modification of the invention, a masking film is provided on portions of the printed circuit to be protected from the solder material.

A preferred example of a process in accordance with the present invention is as follows:

*Example 1*

Figure 1:
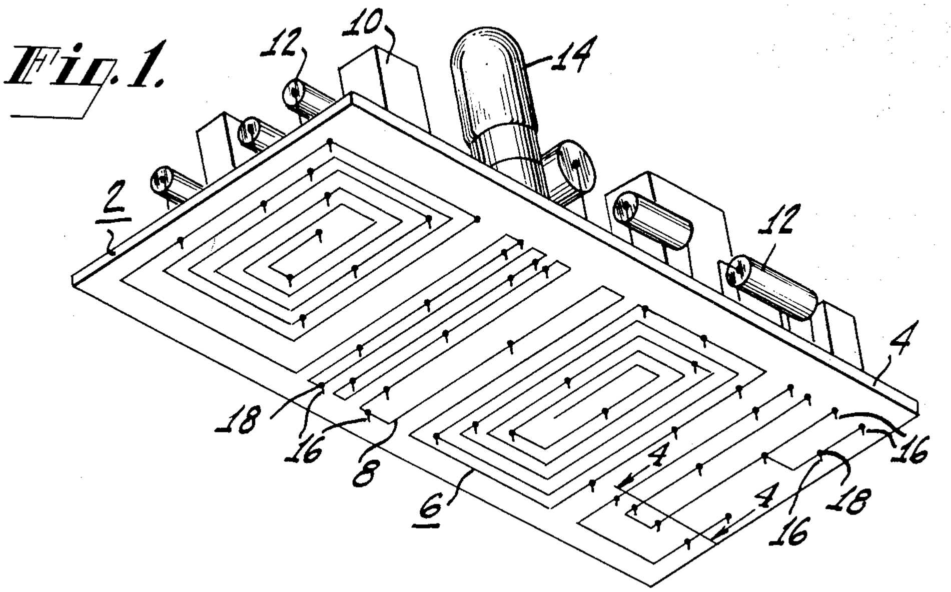
Figure 1 is a perspective view of the under side of an assembly to which the soldering technique of the present invention may be applied.

Referring now to Figure 1, an assembly 2 is prepared for soldering comprising a mounting plate 4 which may be composed of laminated sheets of paper impregnated and surfaced with a synthetic resin. It has disposed on a surface thereof an electrical circuit 6 composed of a plurality of leads or conductors, e. g. fine strips 8 of copper foil. The strips are integrally united to a surface of the synthetic resin-impregnated plate. Mounted on the side of the mounting plate which is opposite from that holding the electrical circuit, are a plurality of circuit components such as capacitors 10, resistors 12, and vacuum tubes 14. These circuit components are provided with wire leads 16 which project through the plate 4. Small diameter holes 18 are provided in the plate to accommodate the wire leads.

In carrying out the soldering operation, the lower side of this assembly is first cleaned and dried and then brought into contact with a flux such as a solution of alcoholic resin. It is then removed from the flux and promptly dipped, lower face down, beneath the surface of a bath of molten solder which may be of any conventional composition such as 60% tin and 40% lead. This solder bath will be maintained at a temperature appropriate to the particular solder being used. Such temperature will conventionally be about 350° F. to 550° F.

Upon removal of the assembly from the solder bath, the strips of copper foil will be found to be completely coated with solder and all of the leads 16 soldered to the strips. However, it will usually also be found that excess solder remains adhered to the various parts of the resin-coated surface of the mounting plate between the copper strips. These "bridgings" are, of course, undesirable since they would result in short-circuits when the assembly is used.

Figure 2:
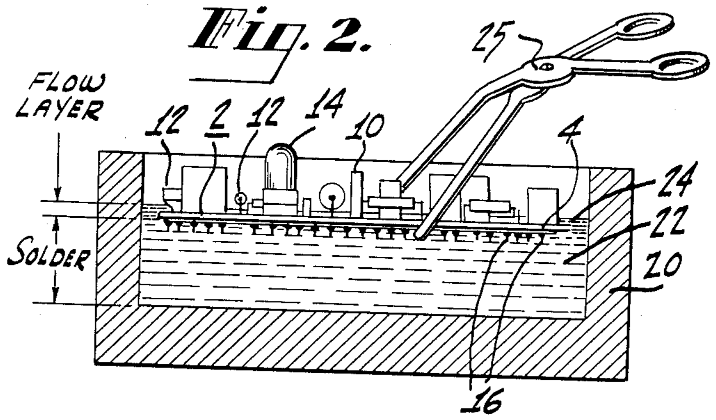
Figure 2 is a view partly in cross-section of a solder bath including a layer of material for removing excess solder, used in the process of the present invention, and showing one manner of immersing the assembly of Figure 1.

Referring now to Figure 2, the next stage in the process is to lower the assembly, after its removal from the first solder bath and printed circuit face down, into a vessel 20 containing another solder bath 22 having floating thereon a layer of liquid 24. Preferably, the immersion in the second bath is caused to take place immediately after the first solder dip to avoid reheating the laminated base plate and the circuit components. This lessens the possibility of damage to these parts. The solder again may be 60% tin and 40% lead. The liquid layer 24 may be composed of molten 2-biphenylyl diphenyl phosphate and may be approximately 1/16" thick. The entire bath may be maintained at a temperature appropriate to the material used and which may be in the range of 350° F. to 550° F. When the assembly is dipped in the solder layer, it is agitated horizontally for a few seconds, e. g. 10 seconds, for example, by means of forceps 25 with the printed circuit at the interface between the solder layer and the wax layer. In order to eliminate the possibility of trapping air bubbles, the assembly should also be rocked gently about its horizontal longitudinal axis. During this period of treatment, it is preferable that there be repeated contact of the tinned, i. e. leads coated with solder, circuit with the surface of the molten solder pool under the layer of organic liquid.

Figures 3, 4:
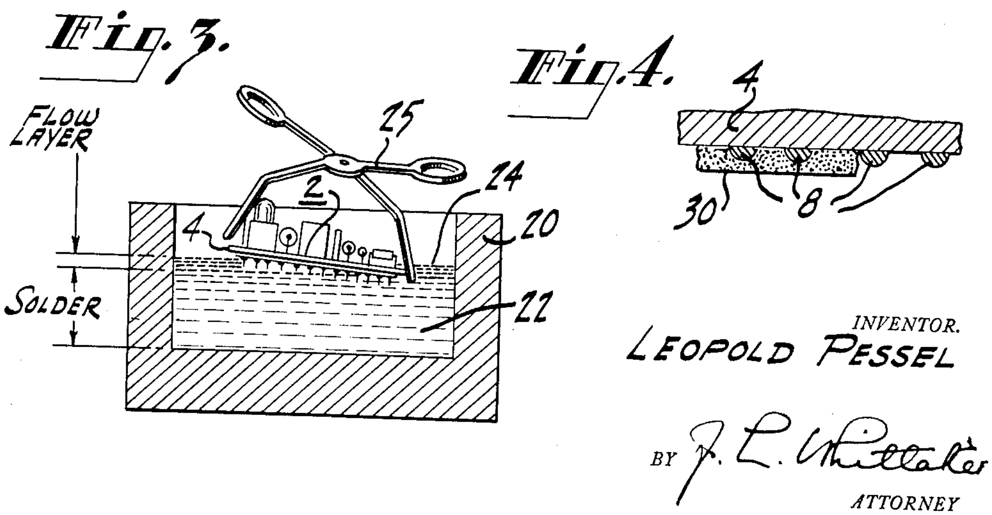
Figure 3 is a cross-sectional view showing a preferred way of removing the assembly of Figure 1 from the bath of Figure 2; and, Fig. 4 is a fragmentary sectional view of the assembly of Fig. 1 prepared for soldering according to a modification of the invention. The section is taken along the line 4—4 in Fig. 1.

Referring to Figure 3, the final stage in the process is the removal of the assembly from the bath by first tilting the assembly about its horizontal longitudinal axis at an angle of about 5° and moving the base plate forward and upward at this angle slowly and until the plate loses contact with the solder and then with the organic liquid. In a successful use of the invention, the tilting motion required about three seconds and the assembly was withdrawn at a rate of about five seconds per inch of travel, such rate being maintained as long as any portion of the circuit was in contact with any part of the bath. The rate at which the assembly can be withdrawn depends partly upon the closeness of spacing of the conductors. The larger the distance between adjacent conductors, the more rapid can be the withdrawal.

In the process described above the function of the organic phosphate layer is to flow the solder adhering to the synthetic resin surface away from such insulating areas without undesirable removal from the conducting metal surfaces. The solder appears to be repelled from the insulating surface and to be attracted by the cohesive force of the solder bath in being returned thereto.

In the above example, many variations may be made without departing from the scope of the invention. For example, the solder composition may be of any conventional type. Also, the liquid layer 24 may be any one of a large number of organic derivatives of organic phosphorus compounds, particularly esters and amides of phosphoric and phosphoric acid. These phosphorus derivatives must be molten in the temperature range in which they are used as flowing agents on top of molten solder, i. e., in the range between 350° F. and 550° F., and they should also be stable in that range, i. e., not subject to excessive decomposition or excessively volatile. They should not react with molten solder to form solid phases which may float on top of the solder as a film. Such a film would counteract any anti-bridging properties by the formation of so-called "dirt bridges." For instance, some sulphur containing organic derivatives of organic phosphorus compounds have been found to produce such an effect by the reaction of the sulfur with the solder or the lead contained in it. Typical phosphorus derivatives which may be used are:

Victor Chemical Works: Victawet 12

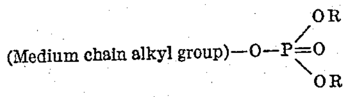

R=water-solubilizing group

Dow Chemical Company: Phosphen 5—2-biphenylyl diphenyl phosphate
Dow Chemical Company: Phosphen 4—Bis-O-chlorophenyl phosphate
Dow Chemical Company: Phosphen 2—Bis (p-tert-butylphenyl phosphate)
Dow Chemical Company: Phosphen 9—Tri-2-biphenylyl phosphate
Victor Chemical Works: Phosphate 1238—High molecular ester of phosphoric acid
Victor Chemical Works: Victamine D

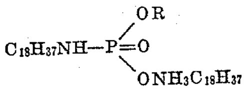

R=water stabilizing group

Victor Chemical Works: Phoresin—Diallyl benzene phosphonate
Di-octyl-styryl phosphonate
Loralkyl acid phosphate
Triphenyl phosphate
Stearyl acid phosphate
Dioctyl phenyl phosphonate

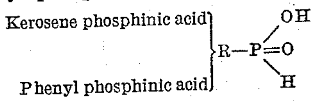

Dioctyl, i-octenyl phosphonate
Phosphated castor oil, ammonium salt

According to the invention, one or more of the foregoing organic phosphorus derivatives may be mixed with one or more organic acids to provide substances having excellent anti-bridging properties. A combination of members of these two different groups provides an anti-bridging effect much greater than would be expected. A tentative explanation for this result is that the oxide sequestering effect is greater in one group (possibly the organic acid group), thus permitting the interfacial tension effect of the other (possibly the phosphorus derivatives) to exert itself to the fullest. Typical acids which may be employed are:

Atlantic Refining Company: Paraffinic acids derived from petroleum MW 315
Atlantic Refining Company: Aromatic acids derived from petroleum MW 206
Ironsides Company: Palmoshield 1-B—vegetable oil 10-12% fatty acids
Nopco Chemical Company: Napolcols—polyoxyethylene fatty acid amides
Dimer acid—Dilinoleic acid
Oleic acid
Pelargonic acid
Naphthenic acids
Anisic acid (methoxy-benzoic acid)
Myristic acid
Capric acid
Stearic acid Palmitic acid
Phenyl salicylic acid
2,4,6 trichloro-phenoxyacetic acid
Cyclohexanebutyric acid Another example of the method of the invention is as follows:

*Example 2*

A printed circuit similar to the one described in Example 1, and having various circuit components mounted thereon, as shown in Figure 1, is immersed, without prefluxing, in a bath of solder having a composition 35% tin and 65% lead, the temperature of the bath being maintained at about 500° F. The technique of dipping is the same as in Example 1.

After the soldering stage has been completed, the under side of the assembly is brought into contact with the inter-face between a bath of molten solder having the composition 35% tin and 65% lead and a flow layer of stearyl acid phosphate and stearic acid in approximately equal proportions. The temperature of this bath is also maintained at about 500° F. After agitation at the interface and removal of the assembly as described in Example 1, the excess stearyl acid phosphate and stearic acid mixture is washed off by rinsing in toluol, and the cleaned assembly is dried in air.

Good flow layer liquids may also comprise a mixture of either one or more of the organic phosphorus derivatives alone or with an organic acid combined with an inert oil, wax, or resin such as are disclosed in the aforementioned co-pending application. The mixture must have the characteristics set forth above for the flow layer. Typical waxes which may be used are any petroleum hydrocarbon wax such as Cerese wax, or an animal product wax such as beeswax, or vegetable waxes. Examples of oils which have been found satisfactory are mineral oil, silicone oil, petroleum hydrocarbon oils, hydrogenated peanut oil, palm oil, castor oil, linseed oil, perilla oil and sperm oil. Especially preferred are petroleum oils composed of at least 20%, and preferably more than 50% of cyclic hydrocarbons. Various resins can also be used. Among the resins which have been found useful are polybutene, polyindene, dipentene resins, allyl resins, and polyethylene. In general, any resin may be used which can be melted to form a non-viscous liquid which is thermally stable at the temperature of the molten solder bath. It has also been found that esters, such as butyl stearate, and propylene laurate, relatively inert organic liquids such as glyceryl phthalate, methoxy polyethylene glycol, and phenyl diglycol carbonate may be mixed with one or more phosphorus derivatives.

In mixtures of a phosphorus derivative and an inert oil, wax, or resin, improvement in anti-bridging is first noted, with a mixture containing about 2% of the phosphorus compound. This percentage may go as high as about 95%, leaving a 5% balance for the inert material to exert its beneficial effects. Substantially any of the foregoing phosphorus derivatives and waxes, oils and resins may be combined. Specific examples of typical flow mixtures are given below. The mixture selected depends on the electrical properties desired, on whether it is to be removed by a solvent subsequent to the flowing operation, or whether it is to remain on the circuit. Possible corrosion effects and electrical leakage are also of important considerations.

Examples of suitable mixtures are as follows:

Naphthenic petroleum oil 70%; bis (o-chlorophenyl) phenyl phosphate 30%.

Petroleum microwax 80%; tri-2-biphenylyl phosphate 20%.

Dioctyl phthalate 80%; oleic acid 20%.

Naphthenic petroleum oil 50%; bis (o-chlorophenyl) phenyl phosphate 30%; aromatic acids derived from petroleum 20%.

Naphthenic petroleum oil 50%; bis (o-chlorophenyl) phenyl phosphate 30%; cyclohexane-butyric acid 20%.

Petroleum microwax 50%; tri-2-biphenylyl phosphate 20%; phenyl salicylic acid 30%.

Petroleum microwax 60%; stearyl acid phosphate 20%; stearic acid 20%.

Petroleum microwax 50%; kerosene phosphinic acid 10%; stearic acid 40%.

Another example of the method of the invention is as follows:

*Example 3*

A printed circuit and component assembly of the type shown in Figure 1 but having electrical conductors of silver printed on a steatite plate, the silver having been integrally united to the steatite plate by a firing process, is subjected to an initial soldering process as described in the preceding examples. This time, however, the soldering bath has a composition of 82.5% cadmium and 17.5% zinc and is kept at a temperature of 520° F. Where fluxing is desired, a treatment with zinc-ammonium chloride is used. After the soldering stage, the assembly is permitted to cool and the soldered portion is then scrubbed with warm water to remove all flux residues. The cleaned plate is then dried. As in the preceding examples, the under face of the plate containing the printed circuit is then agitated at the interface between a layer of molten solder having the same composition as in the preceding stage and a flow layer of a mixture of 60% petroleum microwax, 10% kerosene phosphinic acid and 40% stearic acid. This bath is maintained at a temperature of about 520° F. The technique of withdrawing the treated plate from the bath is the same as in the preceding examples.

The particular material selected for the liquid layer floating on the solder depends, in part, on the exact results desired. As previously stated, the principal function of this layer is to provide an agent for causing the solder adhering to the insulating surface to be repelled therefrom and to be drawn back into the main body of the solder bath. If it is also desired that the material of this liquid layer be more or less completely removed from the assembly after treatment, it is desirable to use an oil which is liquid at room temperature. The oily mixtures can usually be washed off the assembly with toluol or other common organic solvents. Vapor degreasing may also be used. If it is desired that the liquid used to repel the solder act as a protective agent for the circuit components afterwards, it is then desirable to use a material which has a waxy or resinous nature. To these waxes may be added plasticizing and anti-fungus agents, if desired.

In the examples previously given, the method of withdrawing the assembly from the second bath is to tilt it about its longitudinal axis at a small angle of, say 5° although this may be somewhat larger, as 10 or 15°, and to move it forward and upward until it emerged from the liquid. This is only a preferred method, however, which is used to advantage if the conductors are very closely spaced, as, for example, 0.01 inch apart. The removal may also be carried out by tilting slightly and lifting the assembly vertically, or, if the conductors are widely spaced, by simply lifting without tilting.

Referring to Figure 4, a further modification of the invention includes the provision of a masking material provided over the portions of the printed circuit to be protected against the deposition of solder thereon. Tube sockets, particularly, may be protected in this manner. The masking material has the quality of being insoluble in the solder flux, generally a resin dissolved in an organic solvent, and the substances comprising the solder bath. According to the invention, the areas to be protected, either the insulating material between the conductive lines or portions of the printed circuit including both the insulating material and the conductive lines, or components mounted thereon are provided with a coating 30 comprising an aqueous solution or emulsion of an organic substance such as a resin, latex, or the like.

Typical masking film-forming materials are cellulose derivatives such as methyl cellulose, sodium carboxy methyl cellulose and hydroxy ethyl cellulose; water soluble starch esters; polyvinyl alcohol and the like. To prepare film-forming solutions of some of the foregoing materials, for example, one per cent by weight of methyl cellulose is dissolved in water. As another example, 150 grams of a grade of polyvinyl alcohol, for example Dupont Elvanol 20–105, are maintained in contact with 1600 cc. of denatured alcohol for three hours. After this soaking period, 1500 cc. of water are added and complete solution is obtained by stirring.

Other suitable masking agents are an emulsion of polyethylene tetrafluoride in an ammoniacal aqueous system, a water emulsion of polyvinyl acetate containing approximately 55% of solids, an emulsion of copolymers of butadiene and acrylonitrile in a water-solvent carrier system.

The film-forming material may be applied by painting, dipping, rolling, spraying, silk-screening or by some other suitable process. The material is dried in any suitable manner, as by means of infra-red lamps, oven-drying, air drying, or the like. When the water evaporates from an emulsion, the colloidal solid particles coalesce into a continuous film which is highly resistant to re-solution by solvents after the protective coating has hardened.

Finally the printed circuit and components thus protected may be soldered by the method set forth in any one of the foregoing examples.

What is claimed is:

1. A method of dip soldering an assembly comprising a plurality of closely spaced electrical conductors disposed on a surface of a sheet of insulating material, said method comprising the steps of immersing said assembly in a bath of molten solder and removing said assembly from said bath whereby said conductors are coated with solder but some of said solder bridges between two of said closely spaced conductors; then, dipping said assembly in a second bath of molten solder having floating thereon a layer of relatively inert liquid material, said layer including at least one member of the group consisting of organic derivatives of organic phosphorus compounds, a mixture of one or more organic derivatives of organic phosphorus compounds and one or more organic acids, a mixture of one or more organic derivatives of organic phosphorus compounds and an oil, wax, or resin, and one or more organic derivatives of organic phosphorus compounds with one or more organic acids and with an oil, wax, or resin; the members of said group being molten and stable in the range of 350° F.–550° F. and being inert with respect to said molten solder, agitating said assembly with the surface of said insulating material down at the interface between said second solder bath and said floating layer until substantially all of said solder bridging between said two of said conductors is removed; and removing said assembly from said floating layer.

2. The method according to claim 1 and wherein selected portions of said assembly are provided with a coating of a masking material insoluble in materials employed in soldering said assembly.

3. The method according to claim 1 and wherein selected portions of said assembly are provided with a coating of a masking material which is insoluble in organic solvents and is selected from the group consisting of poly-ethylene tetrafluoride in an ammoniacal aqueous system, a water emulsion of polyvinyl acetate containing approximately 55% solids, an emulsion of copolymers of butadiene and acrylonitrile in a water-solvent carrier system, methyl cellulose, sodium carboxyl methyl cellulose, hydroxy ethyl cellulose, water soluble starch esters, and poyvinyl alcohol.

4. A method according to claim 1 in which said conductors are of copper.

5. A method according to claim 1 in which said conductors are of silver.

6. A method according to claim 1 in which said floating layer is selected from the class consisting of esters and amides of organic phosphorus compounds which are thermally stable at temperatures up to 600° F.

7. A method according to claim 1 in which said floating layer is selected from the class consisting of esters and amides of phosphoric acid which are thermally stable at temperatures up to 600° F.

8. A method according to claim 1 in which said assembly is removed from said second solder bath by tilting said insulating material surface at a small angle to the horizontal and moving said assembly slowly in a vertical direction.

9. A method according to claim 1 wherein the dipping in said second bath occurs immediately after removal from said first bath.

10. A method of dip soldering an assembly comprising a plurality of closely spaced electrical conductors disposed on a surface of a sheet of insulating material, comprising immersing said assembly in a bath of molten solder and removing said assembly from said bath whereby said conductors are coated with solder but some of said solder bridges between two of said closely spaced conductors, then dipping said assembly in a second bath of molten solder having floating thereon a layer of relatively inert liquid material, said layer including at least one organic derivative of an organic phosphorus compound which is molten and stable in the range of 350° F.–550° F. and is inert with respect to said molten solder, holding said assembly, with said conductors face downward, at the interface between the second solder bath and said floating layer while making repeated contact between the solder bridging between said two of said closely spaced conductors and the molten solder in said second bath until substantially all of said solder bridging between said two of said conductors is removed, and removing said assembly from said floating layer.

References Cited in the file of this patent

UNITED STATES PATENTS 2,671,264 Pessel ---------------- Mar. 9, 1954